United States Patent
Li et al.

(10) Patent No.: US 12,340,115 B2
(45) Date of Patent: *Jun. 24, 2025

(54) DATA PREPROCESSING (DPP) PATTERN SUPPORTING BOTH NORMAL PROGRAM AND EARLY CACHE RELEASE PROGRAM (ECRP)

(71) Applicant: YANGTZE MEMORY TECHNOLOGIES CO., LTD., Wuhan (CN)

(72) Inventors: Jianjie Li, Wuhan (CN); Weijun Wan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,072

(22) Filed: Mar. 6, 2024

(65) Prior Publication Data

US 2024/0248640 A1    Jul. 25, 2024

Related U.S. Application Data

(63) Continuation of application No. 17/808,318, filed on Jun. 23, 2022, now Pat. No. 12,014,075.

(30) Foreign Application Priority Data

Apr. 27, 2022   (CN) .......................... 202210463916.5

(51) Int. Cl.
*G06F 12/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
USPC ........................................................ 711/154
See application file for complete search history.

(56) References Cited

U.S. PATENT DOCUMENTS

| | | |
|---|---|---|
| 11,200,951 B2 | 12/2021 | Funatsuki et al. |
| 2006/0221724 A1 | 10/2006 | Maheshwari et al. |
| 2018/0060194 A1* | 3/2018 | Ryu .................... G06F 11/108 |
| 2022/0028466 A1 | 1/2022 | Kim et al. |
| 2023/0280929 A1* | 9/2023 | Lu ........................ G06F 3/0655 |

FOREIGN PATENT DOCUMENTS

KR   20180060524 A   6/2018

* cited by examiner

*Primary Examiner* — Mardochee Chery
(74) *Attorney, Agent, or Firm* — BAYES PLLC

(57) ABSTRACT

In an aspect, a memory device includes page buffers and a controller coupled to the page buffers. Each of the page buffers includes N data latches configured to store data, where N is a positive integer. The controller is configured to receive data that includes data units, wherein each of the data units includes N bits, store the data units in the N data latches, convert the data stored in the N data latches based on a table, and program cells of the memory device based on the converted data. The table include N rows and $2^N$ columns of bits. Bits from column $2^{N-1}+2$ to column $2^N$ in $N^{th}$ row of the table are identical.

20 Claims, 11 Drawing Sheets

400

| Before DPP | LV0 | LV1 | LV2 | LV3 | LV4 | LV5 | LV6 | LV7 |
|---|---|---|---|---|---|---|---|---|
| D1(LP) | 1 | 0 | 0 | 0 | 0 | 1 | 1 | 1 |
| D2(MP) | 1 | 1 | 0 | 0 | 1 | 1 | 0 | 0 |
| DC(UP) | 1 | 1 | 1 | 0 | 0 | 0 | 0 | 1 |

402

| After DPP | LV0 | LV1 | LV2 | LV3 | LV4 | LV5 | LV6 | LV7 |
|---|---|---|---|---|---|---|---|---|
| D1'(LP) | 1 | 0 | 1 | 0 | 0 | 1 | 0 | 1 |
| D2'(MP) | 1 | 0 | 0 | 1 | 0 | 1 | 1 | 0 |
| DC'(UP) | 1 | 0 | 0 | 0 | 1 | 0 | 1 | 1 |

| Before DPP | LV0 | LV1 | LV2 | LV3 | LV4 | LV5 | LV6 | LV7 |
|---|---|---|---|---|---|---|---|---|
| D1(LP) | 1 | 0 | 0 | 0 | 0 | 1 | 1 | 1 |
| D2(MP) | 1 | 1 | 0 | 0 | 1 | 1 | 0 | 0 |
| DC(UP) | 1 | 1 | 1 | 0 | 0 | 0 | 0 | 1 |

502

| After DPP | LV0 | LV1 | LV2 | LV3 | LV4 | LV5 | LV6 | LV7 |
|---|---|---|---|---|---|---|---|---|
| D1'(LP) | 1 | 0 | 1 | 0 | 1 | 0 | 1 | 0 |
| D2'(MP) | 1 | 0 | 0 | 1 | 1 | 0 | 0 | 1 |
| DC'(UP) | 1 | 1 | 1 | 1 | 0 | 0 | 0 | 0 |

| Before DPP | LV0 | LV1 | LV2 | LV3 | LV4 | LV5 | LV6 | LV7 |
|---|---|---|---|---|---|---|---|---|
| D1(LP) | 1 | 0 | 0 | 0 | 0 | 1 | 1 | 1 |
| D2(MP) | 1 | 1 | 0 | 0 | 1 | 1 | 0 | 0 |
| DC(UP) | 1 | 1 | 1 | 0 | 0 | 0 | 0 | 1 |

602

| After DPP | LV0 | LV1 | LV2 | LV3 | LV4 | LV5 | LV6 | LV7 |
|---|---|---|---|---|---|---|---|---|
| D1'(LP) | 1 | 0 | 1 | 0 | 1 | 0 | 1 | 0 |
| D2'(MP) | 1 | 0 | 0 | 1 | 1 | 0 | 0 | 1 |
| DC'(UP) | 1 | 0 | 0 | 0 | 0 | 1 | 1 | 1 |

| | S0 | DS | DL | D1 | D2 | DC |
|---|---|---|---|---|---|---|
| LV0 | x | 1 | 1 | 1 | 1 | NextLP |
| LV1 | x | 1 | 1 | 1 | 1 | NextLP |
| LV2 | x | 1 | 1 | 1 | 1 | NextLP |
| LV3 | x | 1 | 1 | 1 | 1 | NextLP |
| LV4 | x | 1 | 1 | 1 | 1 | NextLP |
| LV5 | x | 0/1 | 0/1 | 0 | 0 | NextLP |
| LV6 | x | 0/1 | 0/1 | 1 | 0 | NextLP |
| LV7 | x | 0/1 | 0/1 | 0 | 1 | NextLP |

|     | S0 | DS  | DL  | D1     | D2 | DC     |
|-----|----|-----|-----|--------|----|--------|
| LV0 | x  | 1   | 1   | NextLP | 1  | NextMP |
| LV1 | x  | 1   | 1   | NextLP | 1  | NextMP |
| LV2 | x  | 1   | 1   | NextLP | 1  | NextMP |
| LV3 | x  | 1   | 1   | NextLP | 1  | NextMP |
| LV4 | x  | 1   | 1   | NextLP | 1  | NextMP |
| LV5 | x  | 1   | 1   | NextLP | 1  | NextMP |
| LV6 | x  | 0/1 | 0/1 | NextLP | 0  | NextMP |
| LV7 | x  | 0/1 | 0/1 | NextLP | 1  | NextMP |

| | S0 | DS | DL | D1 | D2 | DC |
|---|---|---|---|---|---|---|
| LV0 | x | 1 | 1 | NextLP | NextMP | NextUP |
| LV1 | x | 1 | 1 | NextLP | NextMP | NextUP |
| LV2 | x | 1 | 1 | NextLP | NextMP | NextUP |
| LV3 | x | 1 | 1 | NextLP | NextMP | NextUP |
| LV4 | x | 1 | 1 | NextLP | NextMP | NextUP |
| LV5 | x | 1 | 1 | NextLP | NextMP | NextUP |
| LV6 | x | 1 | 1 | NextLP | NextMP | NextUP |
| LV7 | x | 0/1 | 0/1 | NextLP | NextMP | NextUP |

Fig. 9

DATA PREPROCESSING (DPP) PATTERN SUPPORTING BOTH NORMAL PROGRAM AND EARLY CACHE RELEASE PROGRAM (ECRP)

CROSS-REFERENCE TO RELATED APPLICATIONS

This application is a continuation of U.S. application Ser. No. 17/808,318, filed on Jun. 23, 2022, issued as U.S. Pat. No. 12,014,075, which claims the benefit of priority to C.N. Application No. 202210463916.5, filed on Apr. 27, 2022, both of which are hereby incorporated by reference herein in their entireties.

TECHNICAL FIELD

This description relates to a memory device and a method for data preprocessing. Specifically, the memory device and the method improve the efficiency of program operations.

BACKGROUND

A flash memory chip can receive data to be written in memory cells of the flash memory chip. In some aspects, the flash memory chip stores the data in a page buffer. For example, the page buffer can include one or more data latches, each of which can store a page of data. In some aspects, the memory cells of the flash memory chip are also referred to as cells of the flash memory chip.

In some aspects, the received data includes one or more data units, each of which corresponds to a cell of the flash memory chip. A controller of the flash memory chip programs the one or more data units into their corresponding cells by controlling voltage levels that are applied to the cells. Depending on binary codes included in the one or more data units, the controller programs the cells to different voltage levels.

In some aspects, the controller also verifies whether a set of cells are successfully programmed. For example, the controller determines the set of cells and a target voltage level corresponding to the set of data units. The controller then checks whether the set of cells satisfies a voltage requirement corresponding to the target voltage level.

In some aspects, the controller performs a normal program when selecting the one or more data units to be written into their corresponding cells. For example, the controller can select a set of data units that have "0" in their first and second bits, regardless of values of other bits. However, the normal program may cause the controller to select data units in error.

In some aspects, the one or more data units are stored in one or more data latches of the flash memory chip. The controller can release the one or more data latches prior to programing all of the one or more data units. However, the controller may release the one or more data latches later than an early release requirement causing a system error.

SUMMARY

Some aspects of this disclosure relate to memory devices and methods for data preprocessing. For example, the memory devices and the methods are provided for improving the efficiency of programing operations.

Some aspects of this disclosure provide a flash memory chip that includes a page buffer. The flash memory chip can receive data to be written in cells of the flash memory chip. In some aspects, the cells of the flash memory chip are also referred to as memory cells of the flash memory chip. The flash memory chip can store the received data in the page buffer. In some aspects, the page buffer includes one or more data latches. For example, the page buffer may include three data latches: a lower page (LP), a middle page (MP), and an upper page (UP). In such a case, the received data may include one or more data units, each of which includes three bits that are stored in the three data latches respectively. In other words, a first bit of a data unit is stored in the LP, a second bit of the data unit is stored in the MP, and a third bit of the data unit is stored in the UP.

In some aspects, a controller of the flash memory chip converts the data units into a different pattern before programing the cells. For example, the controller may convert the data units based on a first table and second table. The first and the second tables may be three by eight binary tables. The controller may determine that a data unit matches a column of the first table and converts the data unit to a binary code of a corresponding column of the second table. For example, the data unit includes a binary code (010). The controller determines that a column No. 2 of the first table also includes the binary code (010). In such a case, the controller then retrieves a second binary code, such as (001), from a column No. 2 of the second table and converts the data unit to the second binary code, such as (001).

In some aspects, the controller writes the one or more data units into their corresponding cells by applying voltage levels to the cells. Depending on binary codes included in the one or more data units, the controller programs the cells to different voltage levels. In some aspects, the controller programs cells of a voltage level in a batch manner. For example, because the voltage levels depend on the binary codes included in the data units, the controller determines that a set of data units of the one or more data units include a binary code, such as (010). The controller determines a voltage level corresponding to the binary code and a set of cells corresponding to the set of data units. The controller then programs the set of cells to the voltage level.

In some aspects, the controller also verifies whether the set of cells is successfully programmed. Similarly, the control verifies cells of the same voltage level in a batch manner. For example, the controller selects the set of data units includes the binary code, such as (010). The controller then determines the voltage level corresponding to the binary code and the set of cells corresponding to the set of data units. Finally, the controller checks whether the set of cells satisfies a voltage requirement corresponding to the voltage level. The voltage requirement may be the voltage level or a portion of the voltage level. For example, the voltage level can be 1 V. The voltage requirement may be 1 V or 0.9 V, which is 90% of the voltage level.

In some aspects, the controller selects the set of data units based on "0" included in the data units. For example, to select data units that include the binary code (010), the controller selects the data units that have "0" in their first and third bits. In some aspects, it can be more efficient for the controller to search for "0" instead of "1." For example, the controller may select the set of data units with a shorter amount of time by searching for 0. After the set of data units is verified, the controller converts the set of data units to be all "1," such as a binary code (111). In such a case, the set of data units does not have "0" anymore and thus will not be selected. In other words, the controller will no longer verify the set of cells corresponding to the set of data units in future verifications.

It is also worth noting that a second set of data units having a binary code (000) will also be selected when selecting the data units that include the binary code (010). This is because the binary code (000) also has "0" in its first and third bits. In such a case, cells corresponding to the second set of data units may be verified using the voltage requirement. However, this may not be desirable because the second set of data units may correspond to a second voltage requirement that is higher than the voltage requirement. Therefore, the cells corresponding to the second set of data units may pass verification even with voltages lower than the second voltage requirement and higher than the voltage requirement. Phrased differently, the cells corresponding to the second set of data units may pass verification in error. To avoid such a situation, as explained in more details below, the data preprocessing may be designed in a way that the second set of data units having the binary code (000) are programed and verified prior to the set of data units having the binary code (010). Therefore, after the cells corresponding to the second set of data units are verified, the second set of data units are converted to (111) and will no longer be programed and verified.

In some aspects, the controller can release one or more data latches of the page buffer before all the data units are written into their corresponding cells. For example, when only two sets of data units remain to be programed and verified, two data latches may be enough. The two sets of data units can have binary codes (011) and (101) respectively. Therefore, third bits of the two sets of data units are both "1" and are not necessary for selecting either of the two sets of data units. In such a case, the controller may release the data latch that stores the third bits, such as the UP latch. The UP latch can then be used to receive additional data for further programing operations and thus improve efficiency. In some aspects, as explained in more details below, the second table may impact when the controller can release a data latch.

This Summary is provided merely for purposes of illustrating some aspects to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings are incorporated herein and form a part of the specification.

FIG. 4 illustrates an example of data preprocessing (DPP) with normal programming, according to aspects of the present disclosure.

FIG. 5 illustrates an example of data preprocessing with early release operations, according to aspects of the present disclosure.

FIG. 6 illustrates an example of data preprocessing with both normal programming and early release operations, according to aspects of the present disclosure.

FIG. 7 illustrates an example of an early release operation at level 5, according to aspects of the present disclosure.

FIG. 8 illustrates an example of an early release operation at level 6, according to aspects of the present disclosure.

FIG. 9 illustrates an example of an early release operation at level 7, according to aspects of the present disclosure.

Figure 1:
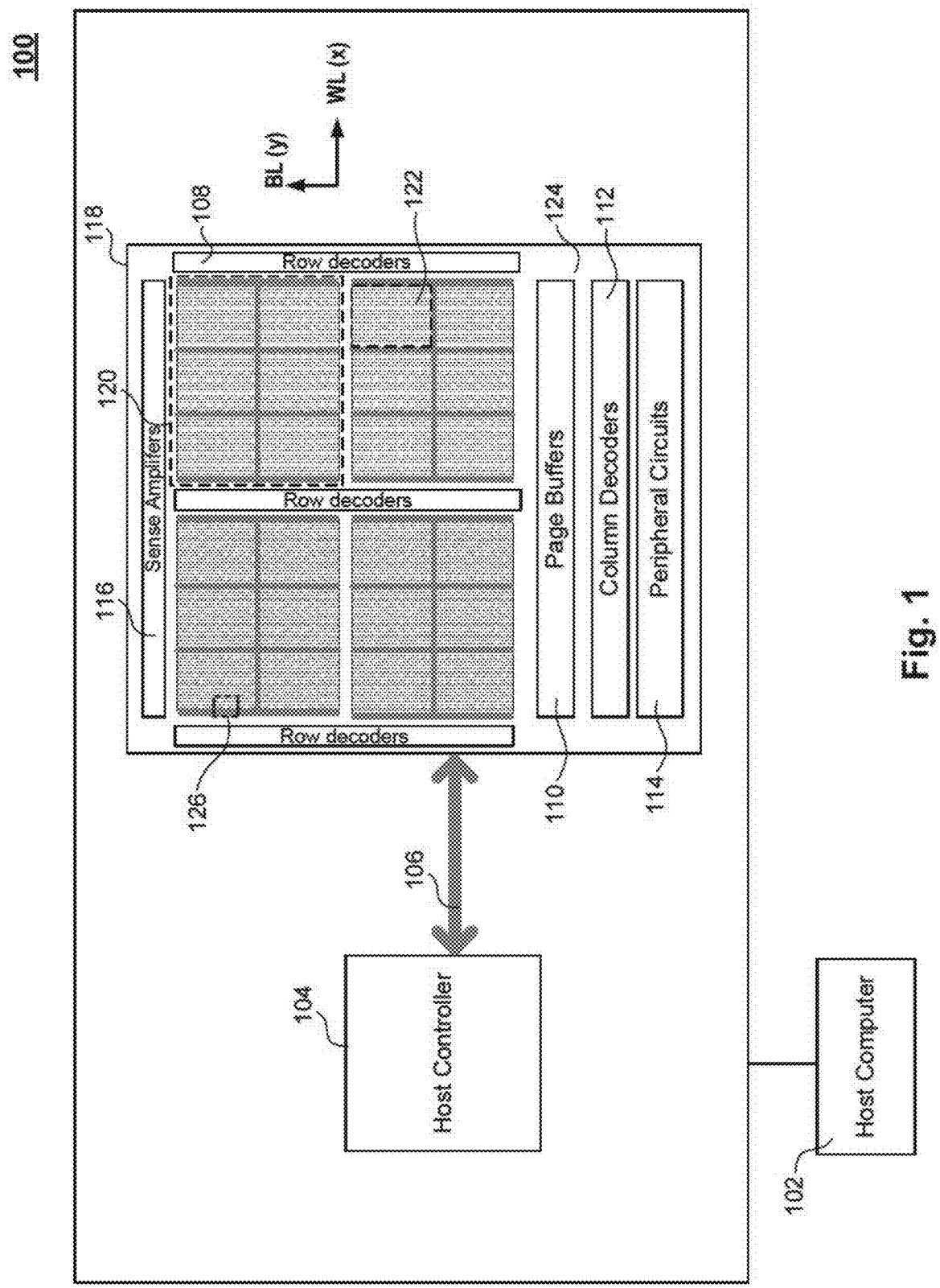
FIG. 1 illustrates an example system of a storage system with a NAND flash memory, according to aspects of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some aspects," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to affect such feature, structure, or characteristic in connection with other aspects whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1 illustrates a storage system 100, according to some aspects of the present disclosure. The storage system 100 can also be referred to as a solid-state drive (SSD) 100, which includes a NAND flash memory 118 and a host controller 104. The SSD 100 can communicate with a host computer 102 through the host controller 104, where the host controller 104 can be connected to the NAND flash memory 118 via a memory channel 106. In some aspects, the SSD 100 can have more than one NAND flash memory 118, while each NAND flash memory 118 can be managed by the host controller 104. In some aspects, the host controller 104 includes one or more processors.

The host computer 102 sends data to be stored at the SSD 100 or retrieves data by reading the SSD 100. The host controller 104 can handle I/O requests received from the host computer 102, ensure data integrity and efficient storage, and manage the NAND flash memory 118. The memory channel 106 can provide data and control communication between the host controller 104 and the NAND flash memory 118 via a data bus.

The NAND flash memory 118 (i.e., "flash," "NAND flash" or "NAND") can be a memory chip (package), a memory die or any portion of a memory die, and can include one or more memory planes 120, each of which can include a plurality of memory blocks 122. Identical and concurrent operations can take place at each memory plane 120. The memory block 122, which can be megabytes (MB) in size, is the smallest size to carry out erase operations. As shown in FIG. 1, the exemplary NAND flash memory 118 includes four memory planes 120 and each memory plane 120 includes six memory blocks 122. Each memory block 122 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, the memory block 122 is also referred to as the "memory array" or "array." The memory array is the core area in a memory device, performing storage functions.

The NAND flash memory 118 also includes a periphery region 124, an area surrounding memory planes 120. The periphery region 124 contains digital, analog, and/or mixed-signal circuits to support functions of the memory array, for example, page buffers 110, row decoders 108, column decoders 112, peripheral circuits 114, and sense amplifiers 116. Peripheral circuits 114 include active and/or passive semiconductor devices, such as transistors, diodes, capacitors, resistors, etc., as would be apparent to a person of ordinary skill in the art.

It is noted that the layout of the electronic components in the SSD 100 and the NAND flash memory 118 in FIG. 1 are shown as an example. The SSD 100 and the NAND flash memory 118 can have other layouts and can include additional components. For example, The NAND flash memory 118 can also have high-voltage charge pumps, I/O circuits, etc. The SSD 100 can also include firmware, data scrambler, etc.

Figure 2:
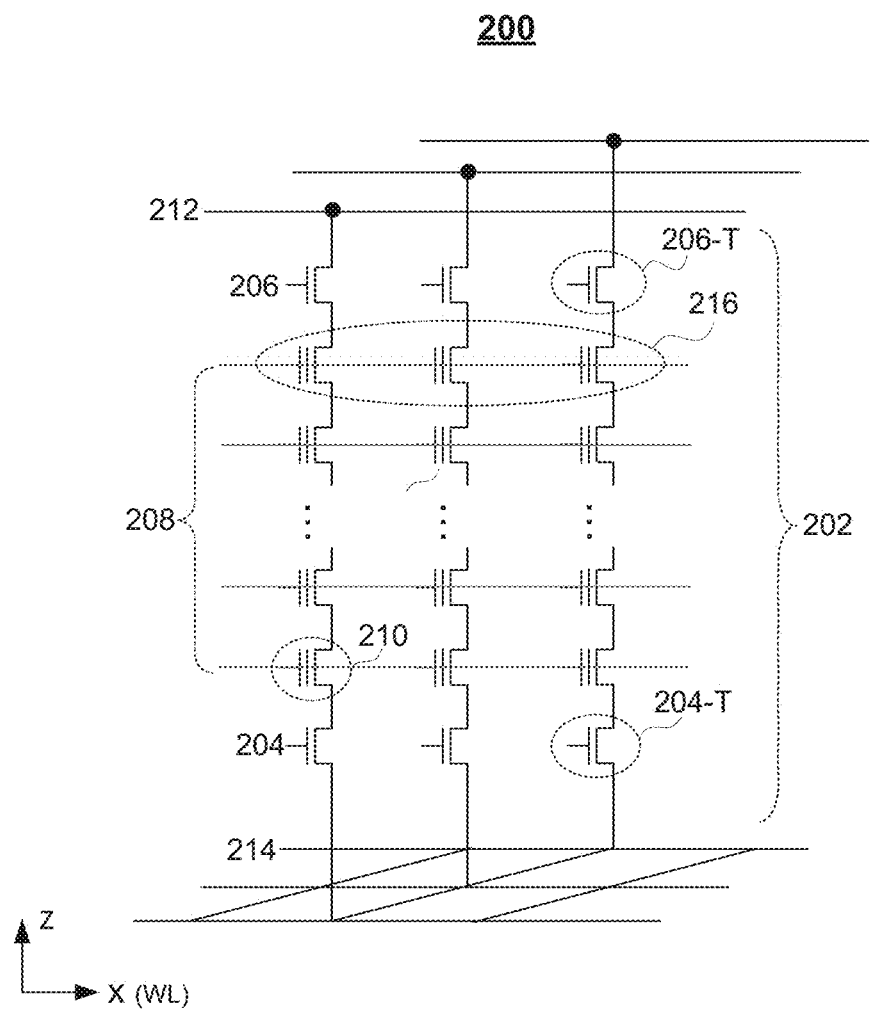
FIG. 2 illustrates an example schematic circuit diagram of a memory array, according to aspects of the present disclosure.

FIG. 2 illustrates an example schematic circuit diagram 200 of the memory block 122, according to some aspects of the present disclosure. The example schematic circuit diagram 200 includes a plurality of memory strings 202, each memory string 202 having a plurality of memory cells 210. The memory string 202 also includes at least one field effect transistor (e.g., MOSFET) at each end, which is controlled by a lower select gate (LSG) 204 and a top select gate (TSG) 206, respectively. And the two respective transistors are referred to as lower and top select transistors 204-T and 206-T. The memory cell 210 can be controlled by a control gate 208, where the control gate 208 can be connected to the word line of the example schematic circuit diagram 200. The drain terminal of the top select transistor 206-T can be connected to the bit line 212, and the source terminal of the lower select transistor 204-T can be connected to an array common source (ACS) 214. The array common source 214 can be shared by the memory strings 202 in an entire memory block, and is also referred to as the common source line.

In some aspects, the example schematic circuit diagram 200 can be formed based on the floating gate technology. In some aspects, the example schematic circuit diagram 200 can be formed based on charge trapping technology. The NAND flash memory based on charge trapping can provide high storage density and high intrinsic reliability. Storage data or logic states (e.g., threshold voltage $V_{th}$ of the memory cell 210) depends on the amount of charge trapped in a storage layer. In some aspects, the NAND flash memory 118 can be a three-dimensional (3D) memory device, and the example schematic circuit diagram 200 can be a 3D memory array, where the memory cells 210 can be vertically stacked on top of each other.

In a NAND flash memory, read and write operations can be performed in a memory page 216, which includes all memory cells 210 sharing the same word line. In a NAND memory, the memory cell 210 can be in an erase state ER or a programmed state P1. Initially, all memory cells 210 in the example schematic circuit diagram 200 can be reset to the erase state ER as logic "1" by implementing a negative voltage difference between the control gates 208 and source terminals of the memory cells (e.g., the array common source 214) such that all the trapped electronic charges in the storage layer of the memory cells 210 can be removed. For example, the negative voltage difference can be induced by setting the control gates 208 of the memory cells 210 to ground, and applying a high positive voltage to the array common source 214. At the erase state ER ("state ER"), the threshold voltage $V_{th}$ of the memory cells 210 can be reset to the lowest value, and can be measured or sensed at the bit line 212.

During programming (i.e., writing), a programming voltage $V_{pgm}$ (e.g., a positive voltage pulse between 10 V and 30 V) can be applied on the control gate 208 such that electronic charges (e.g., electrons) can be injected into the storage layer of the memory cell 210, and thereby increase the threshold voltage $V_{th}$ of the memory cell 210. Thus, the memory cell 210 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 3:
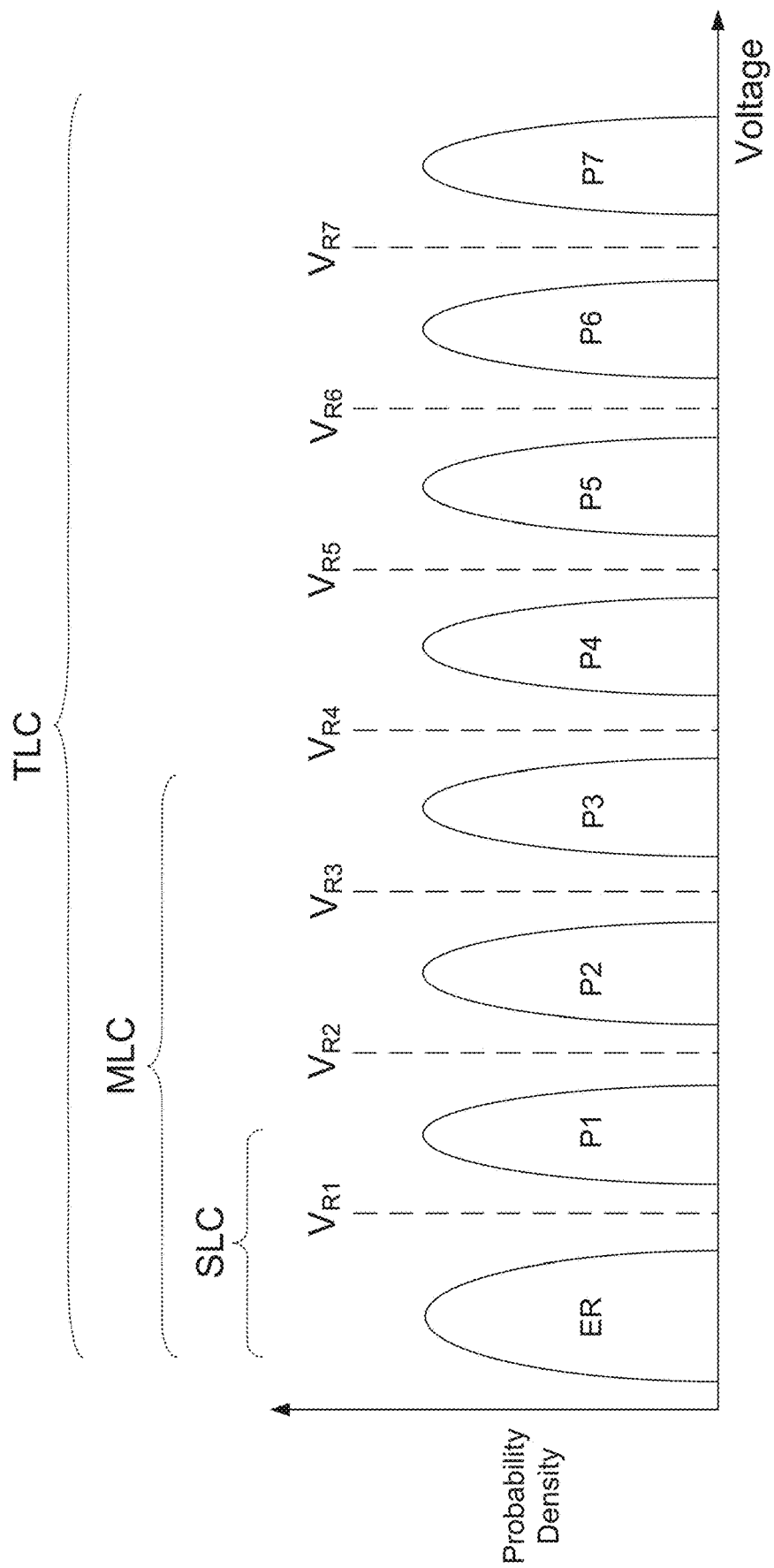
FIG. 3 illustrates an example threshold voltage distribution of a NAND flash memory, according to aspects of the present disclosure.

FIG. 3 illustrates a threshold voltage $V_{th}$ distribution of a NAND flash memory programmed in the triple-level cell (TLC) mode, according to some aspects of the present disclosure. Due to various variations, each state of the memory cells includes a range of threshold voltages $V_{th}$ (x-axis), where the threshold voltage $V_{th}$ distribution of each state can be represented by a probability density (y-axis). In some aspects, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some aspects, to increase the programming speed, memory cells in the same memory page 216 (FIG. 2) shared with the same word line (e.g., same control gates 208) can be programmed simultaneously. After each ISPP pulse, a verify read can be performed. In some aspects, the memory cells which have reached a target state (i.e., a target threshold voltage) can be inhibited from further programming by controlling the TSG 206 and/or LSG 204. In some aspects, memory cells can also be inhibited from further programming by raising the voltage on the corresponding bit lines.

After programming, the eight TLC states ER and P1-P7 can be verified by using one or more read reference voltages $V_{R1}$-$V_{R7}$. By applying one or more of the read reference voltages $V_{R1}$-$V_{R7}$ to the control gate of a target memory cell, the range of the memory cell's threshold voltage $V_{th}$ can be determined. For example, to verify if a target memory cell 340 is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switched on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, the threshold voltage $V_{th}$ or the state of the target memory cell can be verified.

As described above, to determine the two states ER and P1 stored in the SLC mode, only the read reference voltage $V_{R1}$ is needed. To determine the four states ER and P1-P3 in the MLC mode, the read reference voltages $V_{R1}$, $V_{R2}$, and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

In some aspects, to improve reading and programing speed, multiple memory pages ("physical pages") can be read or programmed simultaneously. In MLC, TLC or QLC mode, each memory page can be read or programmed based on one or more logic pages. For example, in the TLC mode of 3 bits per memory cell, a memory page can be programmed based on 3 logic pages, e.g., a lower page, a middle page and an upper page.

FIG. 4 illustrates an example of data preprocessing (DPP) with normal programming, according to aspects of the present disclosure. FIG. 4 can be described with regard to elements of FIGS. 1, 2, and 11. The example 400 can be performed by a storage system (for example, the storage system 100 of FIG. 1). The example 400 can also be performed by the computer system 1100 of FIG. 11. But example 400 is not limited to the specific aspects depicted in those figures and other systems can be used to perform the method, as will be understood by those skilled in the art. It is to be appreciated that not all operations may be needed, and the operations may not be performed in the same order as shown in FIG. 4.

In some aspects, as described above, a flash memory chip, such as the storage system 100, can receive data to be written in cells of the flash memory chip. In some aspects, the cells of the flash memory chip are also referred to as memory cells of the flash memory chip. The received data can include one or more data units. Before the program operation, a controller of the flash memory chip converts the one or more data units based on a table 402 and a table 404. For example, a data unit may include a binary code (010). The controller determines that $5^{th}$ column of the table 402 includes the binary code (010). The controller then determines that the $5^{th}$ column of the table 404 includes a binary code (001) and converts the data unit to the binary code (001).

In some aspects, after converting the data units, the controller performs program operations. The table 404 also serves as a look-up table for program and verification operations. In some aspects, each column of the table 404 corresponds to a voltage level. For example, column 1 corresponds to LV0, which is also referred to as an erase state voltage level. Column 2 corresponds to LV1. In some aspects, LV0 through LV7 corresponding to columns 1 through column 8 are in an increasing order. For example, LV7 has a highest voltage level and LV0 has a lowest voltage level. In some aspects, LV0 corresponds to ER of FIG. 3 and LV1 through LV7 corresponds to P1 through P7 of FIG. 3, as described above. In some aspects, the controller programs cells corresponding to a data unit based on a voltage level determined from the table 404. For example, a data unit including a binary code (010) matches column 4 of the table 404. Therefore, the controller programs a cell corresponding to the data unit until the cell reaches LV3 voltage.

In some aspects, the data unit corresponds to the cell based on a position in data latches. As described above, a page buffer, such as the page buffer 110, can include one or more data latches. For example, here the page buffer includes three data latches: an LP, an MP, and a UP, which are also referred to as a D1 latch, a D2 latch, and a DC latch. Each of the one or more data units includes three bits that are stored in the LP, the MP, and the UP respectively. The controller may determine that the data unit occupies a position, such as $10^{th}$ bit, in each of the LP, the MP, and the UP and determine the cell that corresponds to the position. The controller then configures a voltage applied to the cell to be the LV3 voltage.

In some aspects, the controller programs cells in batches by voltage levels. For example, the controller can program cells to LV1 voltage. The controller selects a first set of data units that include a binary code (000). The controller then locates a first set of cells corresponding the first set of data units based on their positions in the data batches. Finally, the controller programs the first set of cells to the LV1 voltage. In some aspects, after programming the first set of cells, the controller verifies the first set of cells. For example, the controller selects the first set of data units that include the binary code (000) and locates the first set of cells. The controller then checks whether the first set of cells satisfies a first voltage requirement. In some aspects, the first voltage requirement can be LV1 voltage or a portion of LV1 voltage. For example, LV1 voltage can be −1.4 V. The first voltage requirement may be −1.4 V or −1.5 V, which is slightly lower than the LV1 voltage. Similarly, LV2 voltage can be −0.4 V and a second voltage requirement may be −0.4 V or −0.5 V, which is slightly lower than the LV2 voltage. LV3 voltage can be 0.4 V and a third voltage requirement may be 0.4 V or 0.36 V, which is 90% of LV3 voltage. LV3-LV7 voltages correspond to voltage requirements in a similar manner. If the first set of cells satisfies the first voltage requirement, the controller converts the first set of data units to a binary code (111).

In some aspects, the controller programs and verifies cells in a batch manner from a lower voltage level to a higher voltage level. For example, the controller starts batch programing from LV1 because LV0 corresponds to erase state. After the first set of cells are programed, the controller converts the first set of data units to the binary code (111) and starts programing a second set of cells corresponding to the LV2. For example, the controller selects a second set of data units having a binary code (100) and then selects the second set of cells based on the second set of data units.

In some aspects, the controller selects data units by selecting 0. For example, when selecting the second set of data units that include a binary code (100), the controller checks whether a data unit contains "0" in its second and third bits. It can be seen that both the first set of data units would also be selected because the first set of data units includes the binary code (000) that also contains "0" in second and third bits. However, because the controller previously converts the first set of data units to the binary code (111) after verifying the first set of cells, the first set of data units will not be selected and thus avoid an error in selection. In some aspects, selecting data units by selecting 0, as described above, is referred to as a normal program. The normal program can improve the efficiency of selecting because it may be easier to select "0" than to select "1."

To perform the normal program, data units corresponding to a higher voltage have a subset of "0" bits of data units corresponding to a lower voltage. For example, based on the table 404, column 3 has "0" bits in the MP and the UP rows. The "0" bit group of column 3 is thus {the MP row, the UP row}. Therefore, for later columns, such as columns 4-8, "0" bit groups within the MP and the UP rows are subsets of {the MP row, the UP row}. In other words, columns 4-8 do not include "0" bits in both the MP and the UP rows. For example, regarding column 5, only the MP row includes "0" bit. Thus, "0" bit group in the MP and the UP rows for the column 5 is {the MP row}, which is a subset of {the MP row, the UP row}. In this way, when the controller selects data units with "0" bits in the MP and the UP rows (the second and the third bits), data units corresponding to columns 4-8 will not be selected.

In some aspects, the controller can release a data latch before all data units are programed and verified. For example, the controller can release the data latch UP (DC latch) before data units of LV7 are programed and verified. In some aspects, after verifying cells of LV5, the controller converts corresponding data units to the binary code (111). In such a case, the received data units include three kinds of binary codes: (111), (011), and (101). This is because all data units are verified and converted to the binary code (111) except data units corresponding to (011) and (101). With only three possible binary codes, the controller can distinguish with bits in the LP and the MP data latches. For example, to select data units corresponding to LV6 or (011), the controller can select data units with "0" in the LP row. Similarly, the controller can select data units corresponding to LV7 or (101) by selecting "0" in the MP row. Thus, the controller can release the UP data latch, which can be used to store newly received data. However, apply the table 404, the earliest time that the controller can release the UP data latch is after programing and verifying cells of LV5. This may not satisfy the early cache release program (ECRP), which requires releasing the UP data latch before programing and verifying cells of LV5.

FIG. 5 illustrates an example of DPP with early release operations, according to aspects of the present disclosure. FIG. 5 can be described with regard to elements of FIGS. 1, 2, and 11. The example 500 can be performed by a storage system (for example, the storage system 100 of FIG. 1). The example 500 can also be performed by the computer system 1100 of FIG. 11. But example 500 is not limited to the specific aspects depicted in those figures and other systems can be used to perform the method, as will be understood by those skilled in the art. It is to be appreciated that not all operations may be needed, and the operations may not be performed in the same order as shown in FIG. 5.

In some aspects, as described above, the flash memory chip, such as the storage system 100, receives data to be written in cells of the flash memory chip. Before the program operation, the controller of the flash memory chip converts the one or more data units based on a table 502 and a table 504. Afterward, the controller programs and verifies cells by voltage levels from LV1 to LV7. In some aspects, after programing and verifying cells of LV4, the received data units include four kinds of binary codes: (111), (000), (100), and (010). Data units corresponding to LV1 through LV4 are converted to the binary code (111) after verification. Data units corresponding to LV0 originally include the binary code (111). Data units of LV5, LV6, and LV7 correspond to binary codes (000), (100), and (010). With only four possible binary codes, the controller can distinguish data units of different voltage levels with bits in the LP and the MP data latches, i.e., 2 bits for four possibilities. For example, to select data units corresponding to LV5 or (000), the controller can select data units with "0" in both the LP row and the MP row. Similarly, the controller can select data units corresponding to LV6 or (100) by selecting "0" in the MP row. Thus, the controller can release the UP data latch after LV4, which satisfies the ECRP requirement.

On the other hand, applying the table 504, the controller may not perform the normal program. For example, when selecting data units of LV2, the controller selects "0" in the MP row. In addition to the data units of LV2, the controller may select data units of LV5 and LV6. In this case, the controller programs and verifies cells of LV5 and LV6 to have the voltage level of LV2, which would be an error. Furthermore, after verifying the cells of LV5 and LV6, the controller would convert the data units of LV5 and LV6 to the binary code (111) and thus the error would not be discovered by verification.

FIG. 6 illustrates an example of data preprocessing with both normal programing and early release operations, according to aspects of the present disclosure. FIG. 6 can be described with regard to elements of FIGS. 1, 2, and 11. The example 600 can be performed by a storage system (for example, the storage system 100 of FIG. 1). The example 600 can also be performed by the computer system 1100 of FIG. 11. But example 600 is not limited to the specific aspects depicted in those figures and other systems can be used to perform the method, as will be understood by those skilled in the art. It is to be appreciated that not all operations may be needed, and the operations may not be performed in the same order as shown in FIG. 6.

In some aspects, as described above, the flash memory chip, such as the storage system 100, receives data to be written in cells of the flash memory chip. Before the program operation, the controller of the flash memory chip converts the one or more data units based on a table 602 and a table 604. Afterward, the controller programs and verifies cells by voltage levels from LV1 to LV7. In some aspects, after programing and verifying cells of LV4, the received data units include four kinds of binary codes: (111), (001), (101), and (011). Data units corresponding to LV1 through LV4 are converted to the binary code (111) after verification. Data units corresponding to LV0 originally include the binary code (111). Data units of LV5, LV6, and LV7 correspond to binary codes (001), (101), and (011). With only four possible binary codes, the controller can distinguish bits in the LP and the MP data latches, i.e., 2 bits for four possibilities. For example, to select data units corresponding to LV5 or (001), the controller can select data units with "0" in both the LP row and the MP row. Similarly, the controller can select data units corresponding to LV6 or (101) by selecting "0" in the MP row. Thus, the controller can release the UP data latch after LV4, which satisfies the ECRP requirement.

On the other hand, applying the table 604, the controller can also perform the normal program. For example, when selecting data units of LV2, the controller selects "0" in the MP and the UP row. Data units of LV3 through LV7 would not be selected because none of them include "0" in both the MP and the UP row. Therefore, applying the table 604 in programing and verifying operations satisfies both the ECRP requirement and the normal program.

FIG. 7 illustrates an example of an early release operation at level 5, according to aspects of the present disclosure. FIG. 7 can be described with regard to elements of FIGS. 1, 2, and 11. The example 700 can be performed by a storage system (for example, the storage system 100 of FIG. 1). The example 700 can also be performed by the computer system 1100 of FIG. 11. But example 700 is not limited to the specific aspects depicted in those figures and other systems can be used to perform the method, as will be understood by those skilled in the art. It is to be appreciated that not all operations may be needed, and the operations may not be performed in the same order as shown in FIG. 7.

In some aspects, by applying the table 604, the controller can release the DC latch after verifying the cells of LV4. The controller stores newly received data, such as data of the next LP data latch in the DC latch. In some aspects, the controller receives the data of the LP data latch first, then data of the MP data latch, and finally data of the UP data latch.

As described above, the controller selects "0" in the D1 and the D2 latches to program and verify cells of LV5, LV6, and LV7. For, example, the controller selects data units of LV5 that include "0" in the D1 and the D2 latches. Data units of LV6 and LV7 would not be selected because they include "0" in either the D1 latch or the D2 latch, but not in both.

In some aspects, the flash memory chip, such as the storage system 100, also includes a DS data latch. In other words, each of the received data units may also include a fourth bit. The DS data latch initially includes "0" bit for each of the received data units, except for data units of LV0. After cells corresponding to data units are verified, the controller converts corresponding portions of the DS data latch to 1. In some aspects, when programing cells, the controller selects data units based on the DS data latch instead of the D1 data latch (the LP), the D2 data latch (the MP), and the DC data latch (the UP). For example, when programing cells of LV1, the controller selects data units that have "0" in DS data latches and applies LV1 voltage to corresponding cells. In such a case, cells of LV2 through LV7 are also programed and applied LV1 voltage. However, when verifying the cells of LV1, the controller selects based on the D1 data latch (the LP), the D2 data latch (the MP), and the DC data latch (the UP). As described above, the cells of LV2 through LV7 will not be verified. After the cells of LV1 are verified, bits in the DS latches corresponding to the data units of LV1 are converted to 1. For another example, when programing cells of LV2, the controller selects data units that have "0" in DS data latches and applies LV2 voltage to corresponding cells. In such a case, cells of LV3 through LV7 are also programed and applied LV2 voltage. However, the cells of LV1 that are previously programed and verified are not programed here and thus avoid applying LV2, a higher voltage, to the cells of LV1, a lower voltage.

FIG. 8 illustrates an example of an early release operation at level 6, according to aspects of the present disclosure. FIG. 8 can be described with regard to elements of FIGS. 1, 2, and 11. The example 800 can be performed by a storage system (for example, the storage system 100 of FIG. 1). The example 800 can also be performed by the computer system 1100 of FIG. 11. But example 800 is not limited to the specific aspects depicted in those figures and other systems can be used to perform the method, as will be understood by those skilled in the art. It is to be appreciated that not all operations may be needed, and the operations may not be performed in the same order as shown in FIG. 8.

In some aspects, by applying the table 604, the controller further releases the D1 latch after verifying the cells of LV5. The controller moves the data of the next LP data latch into the newly released D1 latch. The controller also stores newly received data, such as data of the next MP data latch in the DC latch. In some aspects, the controller stores newly received data in the DC latch first and then moves to the D1 and the D2 latches in order.

In some aspects, since only one data latch is available, the controller selects "0" in the D2 latch to program and verify cells of LV6. For, example, the controller selects data units that include "0" in the D2 latches. Data units of LV7 would not be selected because they include "1" in the D2 latch.

FIG. 9 illustrates an example of an early release operation at level 7, according to aspects of the present disclosure. FIG. 9 can be described with regard to elements of FIGS. 1, 2, and 11. The example 900 can be performed by a storage system (for example, the storage system 100 of FIG. 1). The example 900 can also be performed by the computer system 1100 of FIG. 11. But example 900 is not limited to the specific aspects depicted in those figures and other systems can be used to perform the method, as will be understood by those skilled in the art. It is to be appreciated that not all operations may be needed, and the operations may not be performed in the same order as shown in FIG. 9.

In some aspects, by applying the table 604, the controller further releases the D2 latch after verifying the cells of LV6. The controller moves the data of the next MP data latch into the newly released D2 latch. The controller also stores newly received data, such as data of the next UP data latch in the DC latch. In such a case, data units of further operations are received and stored.

In some aspects, since D2 is also released, the controller selects data units of LV7 based on the DS data latch in both program operation and verification. As described above, the controller converts corresponding bits of the DS data latches after cells are verified. Since cells of LV7 are not yet programed and verified, the corresponding bits of the DS data latch are "0" and the controller can select data units of LV7 based on the corresponding bits.

Figure 10:
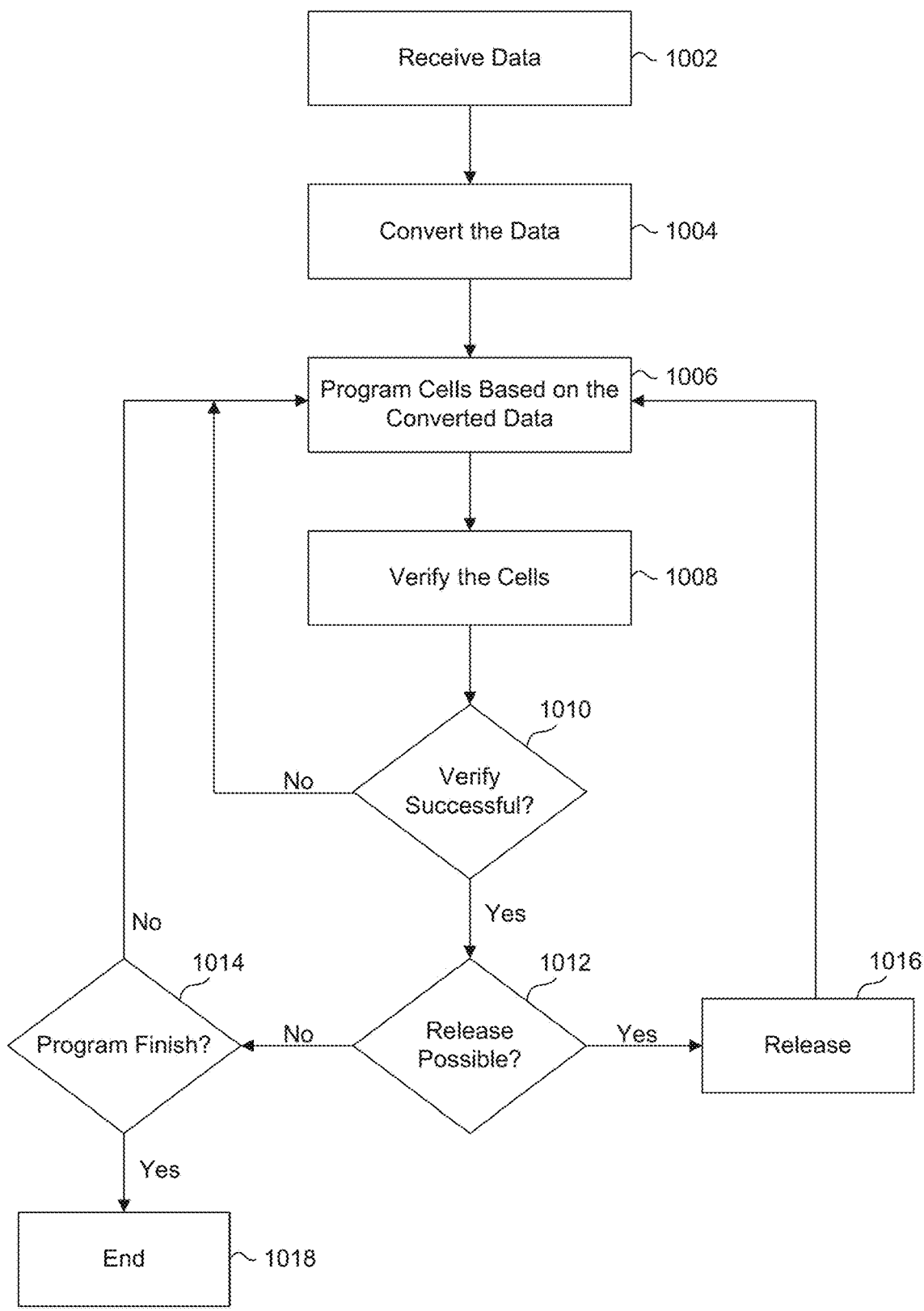
FIG. 10 illustrates an example method of program operation with preprocessing, according to aspects of the present disclosure.

FIG. 10 illustrates an example method of program operation with preprocessing, according to aspects of the present disclosure. As a convenience and not a limitation, FIG. 10 can be described with regard to elements of FIGS. 1, 2, and 11. The example method 1000 can be performed by a storage system (for example, the storage system 100 of FIG. 1). The example method 1000 can also be performed by the computer system 1100 of FIG. 11. But the example method 1000 is not limited to the specific aspects depicted in those figures and other systems can be used to perform the method, as will be understood by those skilled in the art. It is to be appreciated that not all operations may be needed, and the operations may not be performed in the same order as shown in FIG. 10.

At 1002, a flash memory chip, such as the storage system 100, receives data to be written in cells of the flash memory chip. The received data includes one or more data units, each of which includes one or more bits. A controller, such as the host controller 104, stores the data units in a page buffer, such as the page buffer 110. The page buffer may include one or more data latches. For example, the page buffer may include three data latches. Correspondingly, each of the one or more data units includes three bits, that are stored in the three data latches respectively.

At 1004, the controller converts the received one or more data units based on a first table and a second table, such as the table 602 and the table 604 of FIG. 6. For example, the controller determines that a data unit matches a column of the first table and then converts the data unit to a binary code of a corresponding column of the second table.

At 1006, the controller programs cells of the flash memory chip based on the converted data. In some aspects, the controller programs cells of one voltage level at a time, from lower voltage levels to higher voltage levels. For example, referring to the table 604, the controller may program cells of LV1 first. Specifically, the controller selects a first set of data units that correspond to LV1, i.e., data units that include (000). The controller then locates the cells of LV1 and applies ISPP voltages until the cells reach the LV1 voltage level. After which, the control moves to 1008 before programing cells of other voltage levels. In some aspects, cells of LV0 are skipped since LV0 corresponds to an erase state.

At 1008, the controller verify the cells programed in 1006. For example, after the cells of LV1 are programed, the controller checks whether the cells of LV1 satisfy an LV1 voltage requirement. The LV1 voltage requirement can be the LV1 voltage level or a portion of the LV1 voltage level. The controller also counts a number of cells that fail to satisfy the LV1 voltage requirement.

At 1010, the controller determines whether the verification of the cells programed in 1006 is successful. For example, the controller may determine that the verification is not successful if the number of cells that failed is more than a threshold. In such a case, the control moves back to 1006 and the controller programs the cells, such as the cells of LV1, again. Otherwise, the controller may determine that the verification is successful, and the control moves to 1012.

At 1012, the controller determines whether it is possible to release a latch. For example, referring to the table 604, the controller may determine that the DC latch can be released if the cells verified successfully in 1010 are the cells of LV4. The controller may also determine that the D1 latch can be released if the cells verified successfully in 1010 are the cells of LV5. The controller may also determine that the D2 latch can be released if the cells verified successfully in 1010 are the cells of LV6. In any of these cases, the control moves to 1016.

At 1016, the controller releases a data latch, such as the DC latch, the D1 latch, or the D2 latch. The control then moves back to 1006 and the controller programs cells of a next voltage level.

Referring back to 1012, if the controller determines that it is not possible for releasing a data latch, the control moves to 1014.

At 1014, the controller determines whether the program operation is finished. For example, the controller may determine the cells verified successfully in 1010 are the cells of LV7. In such a case, it is not possible to release a data latch because all data latches are released. However, since the cells of LV7 are programed the last, the controller finishes programing the received data units and the program operation is finished. In such a case, the control moves to 1018 and the program operation ends.

Referring back to 1014, the controller may determine that the program operation is not finished. For example, the cells verified successfully in 1010 can be the cells of LV2. Therefore, it is too early to release a data latch and there are more cells to program. In such a case, the control moves to 1006 and the controller continues to program cells of a next voltage level, such as cells of LV3.

Figure 11:
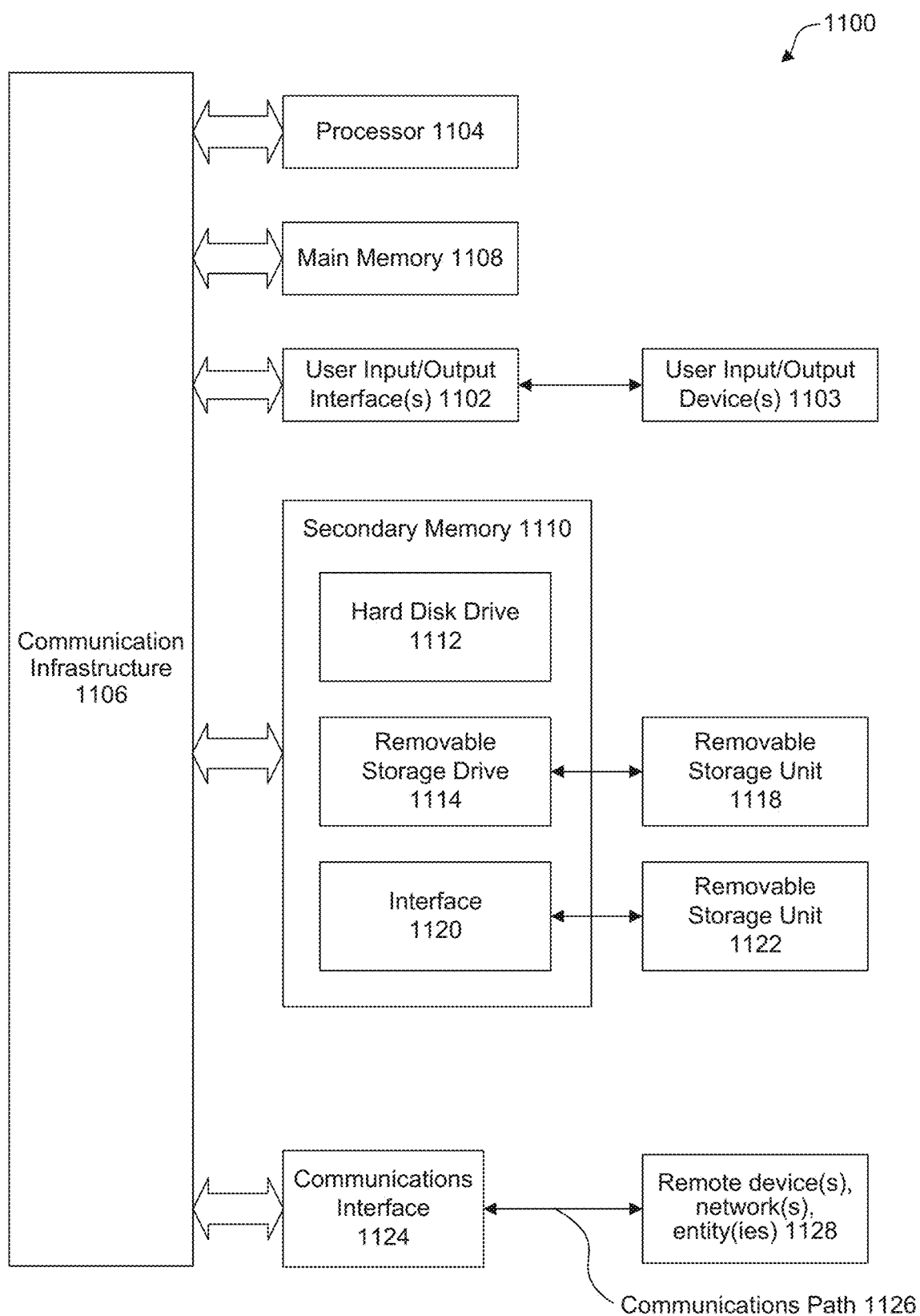
FIG. 11 is an example computer system for implementing some aspects of the disclosure or portion(s) thereof.

Various aspects can be implemented, for example, using one or more computer systems, such as computer system 1100 shown in FIG. 11. Computer system 1100 can be any well-known computer capable of performing the functions described herein such as the storage system 100 of FIG. 1. Computer system 1100 includes one or more processors (also called central processing units, or CPUs), such as a processor 1104. Processor 1104 is connected to a communication infrastructure 1106 (e.g., a bus.) Computer system 1100 also includes user input/output device(s) 1103, such as monitors, keyboards, pointing devices, etc., that communicate with communication infrastructure 1106 through user input/output interface(s) 1102. Computer system 1100 also includes a main or primary memory 1108, such as random-access memory (RAM). Main memory 1108 can include one or more levels of cache. Main memory 1108 has stored therein control logic (e.g., computer software) and/or data.

Computer system 1100 can also include one or more secondary storage devices or memory 1110. Secondary memory 1110 can include, for example, a hard disk drive 1112 and/or a removable storage device or drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data. Removable storage unit 1118 can be a floppy disk, magnetic tape, compact disk, DVD, optical storage disk, and/any other computer data storage device. Removable storage drive 1114 reads from and/or writes to removable storage unit 1118 in a well-known manner.

According to some aspects, secondary memory 1110 can include other means, instrumentalities or other approaches for allowing computer programs and/or other instructions and/or data to be accessed by computer system 1100. Such means, instrumentalities or other approaches can include, for example, a removable storage unit 1122 and an interface 1120. Examples of the removable storage unit 1122 and the interface 1120 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1100 can further include a communication or network interface 1124. Communication interface 1124 enables computer system 1100 to communicate and interact with any combination of remote devices, remote networks, remote entities, etc. (individually and collectively referenced by reference number 1128). For example, communication interface 1124 can allow computer system 1100 to communicate with remote devices 1128 over communications path 1126, which can be wired and/or wireless, and which can include any combination of LANs, WANs, the Internet, etc. Control logic and/or data can be transmitted to and from computer system 1100 via communication path 1126.

The operations in the preceding aspects can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, computer system 1100, main memory 1108, secondary memory 1110 and removable storage units 1118 and 1122, as well as tangible articles of manufacture embodying any combination of the foregoing. Such control logic, when executed by one or more data processing devices (such as computer system 1100), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 11. In particular, aspects can operate with software, hardware, and/or operating system implementations other than those described herein.

In summary, the present disclosure describes various aspects of a memory storage system and methods of making the same.

Some aspects of this disclosure provide a memory device comprising N data latches configured to store data and a controller coupled to the N data latches. The controller is configured to receive the data that includes data units and store the data units in the N data latches, wherein each of the data units includes N rows and each of the N rows contains a bit. The processor is further configured to convert the data units based on a first table and a second table and program cells of the memory device based on the converted data units. The first and the second tables include N rows and $2^N$ columns of bits and bits from column $2^N-N+1$ to column $2^N$ in $N^{th}$ row of the second table are identical. The second table also includes $L^{th}$ column that contains K number of "0" in one or more rows of the $L^{th}$ column. The one or more rows of $M^{th}$ column of the second table contain less than K number of 0, wherein L is less than M.

Some aspects of this disclosure relate to the memory device, wherein to convert the data units, the controller is further configured to determine that a data unit of the data units matches bits of $I^{th}$ column of the first table and convert the data unit to bits of $I^{th}$ column of the second table.

Some aspects of this disclosure relate to the memory device, wherein columns of the second table correspond to respective voltage levels.

Some aspects of this disclosure relate to the memory device, wherein to store the data units in the N data latches, the controller is further configured to store $J^{th}$ bit of each of the data units in $J^{th}$ data latch.

Some aspects of this disclosure relate to the memory device, wherein to program the cells of the memory device based on the converted data units, the controller is further configured to determine that one or more data units of the converted data units match a target column of the second table; determine a target voltage level corresponding to the target column; determine one or more cells of the cells of the memory device corresponding to the one or more data units; and apply the target voltage level to the one or more cells.

Some aspects of this disclosure relate to the memory device, wherein the controller is further configured to verify the one or more cells, the controller configured to determine that a set of rows of the target column of the second table contains "0" bits; determine the one or more data units based on the set of rows; determine the one or more cells based on the one or more data units; verify that voltage levels of the one or more cells are higher than a voltage requirement; and convert one or more rows of the one or more data units to "1" bits based on the set of rows.

Some aspects of this disclosure relate to the memory device, wherein the controller is further configured to: determine that the target column is column $2^{N-1}+1$ of the second table; and release $N^{th}$ data latch of the memory device.

Some aspects of this disclosure provide a method for operating a memory device comprising receiving the data that includes data units, wherein each of the data units includes N bits; storing the data units in the N data latches; converting the data units based on a first table and a second table; and programing cells of the memory device based on the converted data units. The first and the second tables include N rows and $2^N$ columns of bits and bits from column $2^N-N+1$ to column $2^N$ in $N^{th}$ row of the second table are identical. The second table also includes $L^{th}$ column that contains K number of "0" in one or more rows of the $L^{th}$ column. The one or more rows of $M^{th}$ column of the second table contain less than K number of 0, wherein L is less than M.

Some aspects of this disclosure provide the method for operating the memory device, wherein the converting the data units further comprises determining that a data unit of the data units matches bits of $I^{th}$ column of the first table; and converting the data unit to bits of $I^{th}$ column of the second table.

Some aspects of this disclosure provide the method for operating the memory device, wherein columns of the second table correspond to respective voltage levels.

Some aspects of this disclosure provide the method for operating the memory device, wherein the storing the data units in the N data latches further includes storing $J^{th}$ bit of each of the data units in $J^{th}$ data latch.

Some aspects of this disclosure provide the method for operating the memory device, wherein the programing the cells of the memory device based on the converted data units further comprises determining that one or more data units of the converted data units match a target column of the second table; determining a target voltage level corresponding to the target column; determining one or more cells of the cells of the memory device corresponding to the one or more data units; and applying the target voltage level to the one or more cells.

Some aspects of this disclosure provide the method for operating the memory device, further comprising verifying the one or more cells by determining that a set of rows of the target column of the second table contain "0" bits; determining the one or more data units based on the set of rows; determining the one or more cells based on the one or more data units; verifying that voltage levels of the one or more cells are higher than a voltage requirement; and converting one or more rows of the one or more data units to "1" bits based on the set of rows.

Some aspects of this disclosure provide the method for operating the memory device, further comprising determining that the target column is column $2^{N-1}+1$ of the second table; and releasing $N^{th}$ data latch of the memory device.

Some aspects of this disclosure provide a non-transitory computer-readable medium (CRM) comprising instructions to, upon execution of the instructions by one or more processors of a memory device, cause the memory device to perform operations, the operations comprising receiving the data that includes data units, wherein each of the data units includes N bits; storing the data units in the N data latches; converting the data units based on a first table and a second table; and programing cells of the memory device based on the converted data units. The first and the second tables include N rows and $2^N$ columns of bits and bits from column $2^N-N+1$ to column $2^N$ in N row of the second table are identical. The second table also includes $L^{th}$ column that contains K number of "0" in one or more rows of the $L^{th}$ column. The one or more rows of $M^{th}$ column of the second table contain less than K number of 0, wherein L is less than M.

Some aspects of this disclosure provide the non-transitory CRM, wherein the converting the data units further comprises determining that a data unit of the data units matches bits of $I^{th}$ column of the first table; and converting the data unit to bits of $I^{th}$ column of the second table.

Some aspects of this disclosure provide the non-transitory CRM, wherein columns of the second table correspond to respective voltage levels.

Some aspects of this disclosure provide the non-transitory CRM, wherein the storing the data units in the N data latches further includes storing $J^{th}$ bit of each of the data units in $J^{th}$ data latch.

Some aspects of this disclosure provide the non-transitory CRM, wherein the programing the cells of the memory device based on the converted data units further comprises determining that one or more data units of the converted data units match a target column of the second table; determining a target voltage level corresponding to the target column; determining one or more cells of the cells of the memory device corresponding to the one or more data units; and applying the target voltage level to the one or more cells.

Some aspects of this disclosure provide the non-transitory CRM, wherein the operations further comprise verifying the one or more cells by determining that a set of rows of the target column of the second table contain "0" bits; determining the one or more data units based on the set of rows; determining the one or more cells based on the one or more data units; verifying that voltage levels of the one or more cells are higher than a voltage requirement; and converting one or more rows of the one or more data units to "1" bits based on the set of rows.

Some aspects of this disclosure provide the non-transitory CRM, wherein the operations further comprise determining that the target column is column $2^{N-1}+1$ of the second table; and releasing $N^{th}$ data latch of the memory device.

The Summary and Abstract sections can set forth one or more but not all exemplary aspects of the present disclosure as contemplated by the inventor(s), and thus, are not intended to limit the present disclosure and the appended claims in any way.

While the disclosure has been described herein with reference to exemplary aspects for exemplary fields and applications, it should be understood that the disclosure is not limited thereto. Other aspects and modifications thereto are possible, and are within the scope and spirit of the disclosure. For example, and without limiting the generality of this paragraph, aspects are not limited to the software, hardware, firmware, and/or entities illustrated in the figures and/or described herein. Further, aspects (whether or not explicitly described herein) have significant utility to fields and applications beyond the examples described herein.

Aspects have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. In addition, alternative aspects can perform functional blocks, steps, operations, methods, etc. using orderings different from those described herein.

References herein to "one aspect," "an aspect," "an example aspect," or similar phrases, indicate that the aspect described can include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it would be within the knowledge of persons skilled in the relevant art(s) to incorporate such feature, structure, or characteristic into other aspects whether or not explicitly mentioned or described herein.

The breadth and scope of the disclosure should not be limited by any of the above-described exemplary aspects, but should be defined only in accordance with the following claims and their equivalents.

What is claimed is:

1. A memory device comprising:
   page buffers, each of the page buffers comprising N data latches configured to store data, where N is a positive integer; and
   a controller coupled to the page buffers and configured to:
      receive data that includes data units, wherein each of the data units includes N bits;
      store the data units in the N data latches;
      convert the data stored in the N data latches based on a table; and
      program cells of the memory device based on the converted data,
      wherein the table include N rows and $2^N$ columns of bits; and
      wherein bits from column $2^{N-1}+2$ to column $2^N$ in $N^{th}$ row of the table are identical.

2. The memory device of claim 1, wherein $L^{th}$ column of the table contains K number of "0" in N rows of the $L^{th}$ column, and N rows of $M^{th}$ column of the table contain less than or equal to K number of "0";
   wherein L, K, and M are positive integers; and
   wherein L is less than M.

3. The memory device of claim 1, wherein second column of the table contains N number of "0" in N rows of the second column, and N rows of $X^{th}$ column of the table contain less than N number of "0", and wherein X is greater than 2, where X is a positive integer.

4. The memory device of claim 1, wherein columns of the table correspond to a set of respective voltage levels.

5. The memory device of claim 1, wherein to store the data units in the N data latches, the controller is further configured to:
store $J^{th}$ bit of each of the data units in $J^{th}$ data latch, where J is a positive integer.

6. The memory device of claim 1, wherein to program the cells of the memory device based on the converted data, the controller is further configured to:
determine the converted data match a target column of the table;
determine a target voltage level corresponding to the target column;
determine one or more cells of the cells of the memory device corresponding to the converted data; and
program the one or more cells to the target voltage level.

7. The memory device of claim 6, wherein the controller is further configured to verify the one or more cells, the controller is configured to:
determine the target column of the table contains one or more "0" bits;
determine the one or more cells based on the converted data;
verify the voltage levels of the one or more cells;
in response to the voltage levels of the one or more cells are higher than a voltage requirement; and
convert the one or more "0" bits in the data latch corresponding to the one or more cells to "1" bits.

8. The memory device of claim 7, wherein the controller is further configured to:
determine that the target column is column $2^{N-1}+1$ of the table; and
release $N^{th}$ data latch of the memory device.

9. The memory device of claim 7, wherein the controller is further configured to:
in response to the target column is column $2^{N}-1$ or $2^{N}$ of the table, determine the one or more cells based on the converted data and data stored in a DS data latch of the page buffer.

10. The memory device of claim 1, wherein N is greater than or equal to 3.

11. A memory system, comprising:
a memory device, comprising:
page buffers, each of the page buffers comprising N data latches configured to store data, where N is a positive integer; and
a controller coupled to the page buffers and configured to:
receive data that includes data units, wherein each of the data units includes N bits;
store the data units in the N data latches;
convert the data stored in the N data latches based on a table; and
program cells of the memory device based on the converted data,
wherein the table include N rows and $2^{N}$ columns of bits; and
wherein bits from column $2^{N-1}+2$ to column $2^{N}$ in $N^{th}$ row of the table are identical; and a host controller coupled to the memory device and configured to control the memory device.

12. The memory system of claim 11, wherein $L^{th}$ column of the table contains K number of "0" in N rows of the $L^{th}$ column, and N rows of $M^{th}$ column of the table contain less than or equal to K number of "0";
wherein L, K, and M are positive integers; and
wherein L is less than M.

13. The memory system of claim 11, wherein second column of the table contains N number of "0" in N rows of the second column, and N rows of $X^{th}$ column of the table contain less than N number of "0", and wherein X is greater than 2.

14. The memory system of claim 11, wherein columns of the table correspond to a set of respective voltage levels.

15. The memory system of claim 11, wherein to store the data units in the N data latches, the controller is further configured to:
store $J^{th}$ bit of each of the data units in $J^{th}$ data latch, where J is a positive integer.

16. The memory system of claim 11, wherein to program the cells of the memory device based on the converted data, the controller is further configured to:
determine the converted data match a target column of the table;
determine a target voltage level corresponding to the target column;
determine one or more cells of the cells of the memory device corresponding to the converted data; and
program the one or more cells to the target voltage level.

17. The memory device of claim 16, wherein the controller is further configured to verify the one or more cells, the controller is configured to:
determine the target column of the table contains one or more "0" bits;
determine the one or more cells based on the converted data;
verify the voltage levels of the one or more cells;
in response to the voltage levels of the one or more cells are higher than a voltage requirement; and
convert the one or more "0" bits in the data latch corresponding to the one or more cells to "1" bits.

18. The memory system of claim 17, wherein the controller is further configured to:
determine that the target column is column $2^{N-1}+1$ of the table; and
release $N^{th}$ data latch of the memory device.

19. The memory system of claim 11, wherein N is greater than or equal to 3.

20. A method for operating a memory device, comprising:
receiving data that includes data units, wherein each of the data units includes N bits, wherein N is a positive integer;
storing the data units in N data latches;
converting the data stored in the N data latches based on a table; and
programing cells of the memory device based on the converted data,
wherein the table include N rows and $2^{N}$ columns of bits; and
wherein bits from column $2^{N-1}+2$ to column $2^{N}$ in $N^{th}$ row of the table are identical.

* * * * *